United States Patent [19]
Prest

[11] B 3,986,939
[45] Oct. 19, 1976

[54] METHOD FOR ENHANCING THE BONDABILITY OF METALLIZED THIN FILM SUBSTRATES

[75] Inventor: Arthur L. Prest, Watertown, Mass.

[73] Assignee: Western Electric Company, Inc., New York, N.Y.

[22] Filed: Jan. 17, 1975

[21] Appl. No.: 542,135

[44] Published under the second Trial Voluntary Protest Program on February 10, 1976 as document No. B 542,135.

[52] U.S. Cl. ................................. 204/15; 204/29; 204/38 E
[51] Int. Cl.[2] ...................... C25D 5/02; C25D 5/24
[58] Field of Search ............... 204/29, 15, 32 R, 33, 204/34, 38 E

[56] References Cited
UNITED STATES PATENTS

| | | | |
|---|---|---|---|
| 3,467,540 | 9/1969 | Schick | 204/29 |
| 3,745,094 | 7/1973 | Greene | 204/15 |
| 3,862,875 | 1/1975 | Uchytil | 204/15 |

Primary Examiner—T. M. Tufariello
Attorney, Agent, or Firm—D. J. Kirk; D. D. Bosben

[57] ABSTRACT

This disclosure is directed to a method for enhancing the bondability of a metallized thin film substrate having a conductive material electroplated thereon. Prior to such electroplating of conductive material, the metallized substrate is treated with a liquid photosensitive material which is then entirely exposed to ultraviolet light and developed away to effectuate said enhanced bondability of the resulting conductively coated, metallized substrate.

6 Claims, 2 Drawing Figures

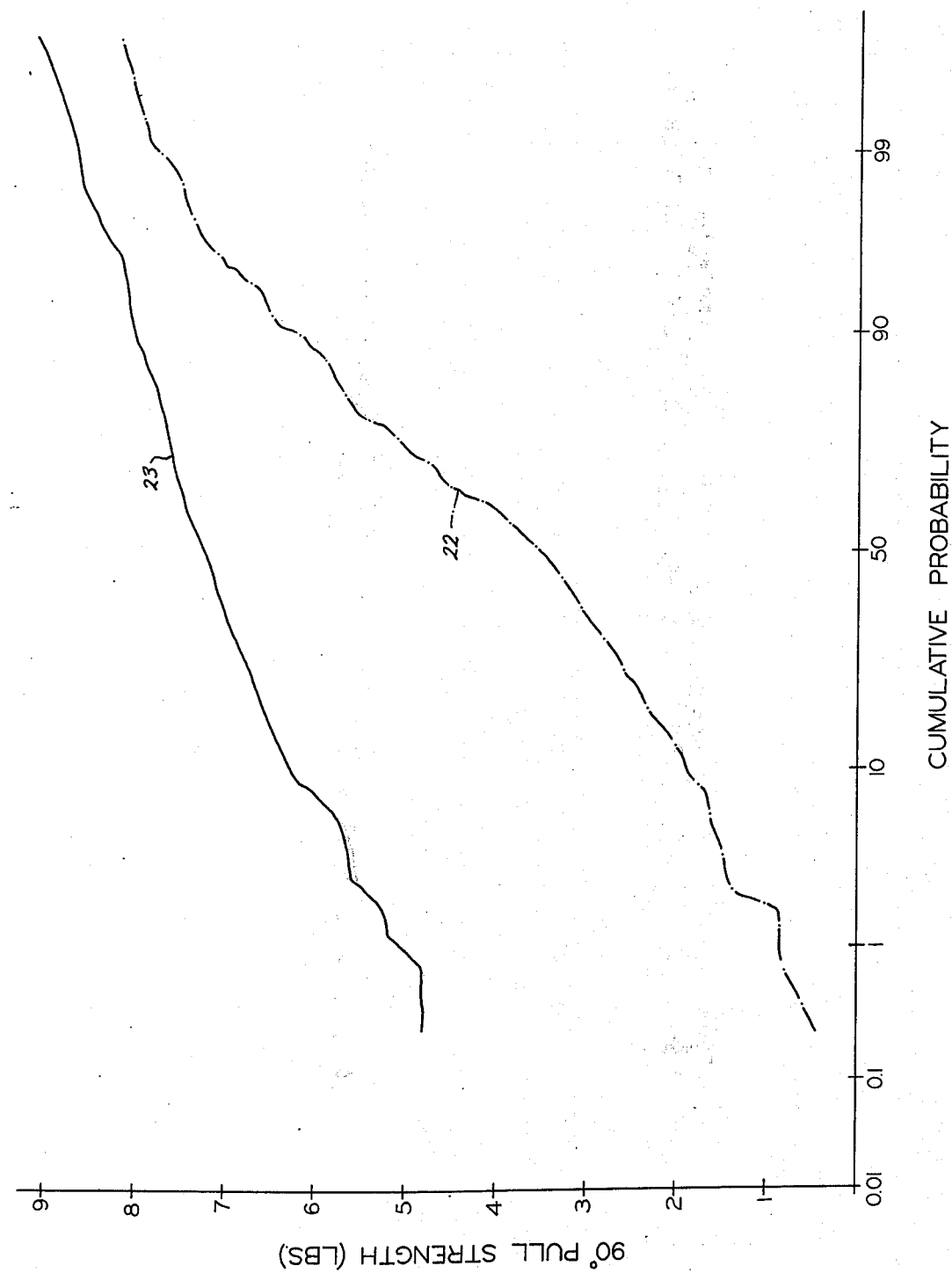

METHOD FOR ENHANCING THE BONDABILITY OF METALLIZED THIN FILM SUBSTRATES

BACKGROUND OF THE INVENTION

1. Field of the Invention

This invention relates to a method for enhancing the bondability of a metallized substrate having conductive material electroplated thereon. In particular, the invention is directed to treating the metallized substrate, prior to electroplating the conductive material thereon, in order to enhance the bondability of the resulting conductively coated metallized substrate.

2. Description of the Prior Art

Thin film electrical circuits may be made by evaporating or sputtering very thin metal films onto an insulative substrate, then a coating of electrically conductive material is evaporated onto the thin films to improve the conductivity of the metallized substrate. Portions of the conductively coated metal films are then removed to form the desired thin film electrical circuit.

Fabrication of such thin film electrical circuits is initiated by sputtering a metallic base layer on the surface of the insulative substrate. Portions of the base layer will be processed subsequently to form thin film components, such as resistors and capacitors. An electrically conductive layer of material on the base layer is required to provide reliable conductive connections between such components and to protect the underlying thin metal films. However, such conductive layer material does not adhere well to the base layer. In order to provide acceptable adhesion, a glue layer of metal is deposited onto the base layer and a metallic diffusion barrier layer is deposited onto the glue layer to prevent undesirable diffusion of the glue layer into the conductive layer.

Normally, the electrically conductive layer is sputtered or evaporated onto the diffusion barrier layer by well-known techniques. Although evaporation and sputtering provide acceptable bondability of the resulting thin film substrates, these deposition methods are slow, inefficient and require complicated and expensive equipment. Such methods result in only a small portion of the material which is used to form the conductive layer being deposited on the metallized substrate for the direction of sputtered or evaporated material is subject to limited control. Although such techniques may be tolerated when evaporating or sputtering material other than precious metals, it is desirable to use more efficient methods when depositing materials such as gold or the like. One such method is electroplating which, advantageously, limits deposition of material to the specific object to be plated.

In recent years attempts have been made to selectively electroplate gold onto thin film metallized substrates in order to conserve this precious metal. This is accomplished by covering the metallized substrate with a liquid photoresist, applying a circuit pattern mask to the surface of the photoresist, exposing the unmasked portions to ultraviolet light and developing away selected portions of the photoresist to form a circuit pattern therein. Gold is then electroplated onto the metallized portions of the substrate from which the photoresist has been selectively removed. The photoresist is then stripped off and the electroplated gold is used as an etch mask as the thin metal films, not protected by the gold, are removed with etchants. Thus, the end product of such a selective plating technique is a gold coated thin film circuit on an insulative substrate. Although the bondability of the resulting thin film circuit was acceptable, it has been found that in such a selective electroplating process there is a breakdown of the photoresist along the edges which define the areas to be gold plated. The electroplated gold creeps under the photoresist, along the surface of the underlying thin film, resulting in poor definition and unreliable thin film circuitry.

An additional method of forming thin film circuits is to electroplate gold on the entire surface of the metallized substrate. Once coated with gold, the surface of the gold is coated with photoresist. A mask is then placed over the photoresist and selected portions thereof exposed and developed away. The undeveloped photoresist protects the desired circuit pattern as the exposed gold and the metallization thereunder is etched away. the undeveloped photoresist is then stripped off leaving only the gold plated thin film circuit pattern on the insulative substrate.

Although this method advantageously precludes the creeping of electroplated gold onto the underlying thin films and results in acceptable circuit definition, an additional problem arose. It was found that the adhesion at the interface of the aforementioned glue layer and the diffusion barrier layer deteriorated causing unacceptably low bond strengths of leads which are bonded to the resulting gold plated thin film circuit conductors and subjected to a 90° pull test.

SUMMARY OF THE INVENTION

The foregoing bondability problem has been solved by the instant method of treating a metallized substrate having a conductive material electroplated thereon. Such treatment comprises the steps of coating the metallized substrate with a positive liquid photosensitive material, then exposing and developing away the entire coating from the metallized substrate prior to electroplating the conductive material thereon.

Such treatment has been found to advantageously preclude deterioration of the adhesion between the metallic layers underlying the conductive material.

Additionally, leads bonded to substrates treated by the instant method exhibit consistently high pull off strengths.

A further advantage accrues due to the fact that electroplating of material is more efficient and results in economies not to be found using evaporating or sputtering techniques.

BRIEF DESCRIPTION OF THE DRAWINGS

FIG. 2 is a graph which compares lead pull off strengths between thin film circuits fabricated with and without benefit of the instant inventive method.

DETAILED DESCRIPTION OF THE PREFERRED EMBODIMENT

Figure 1:
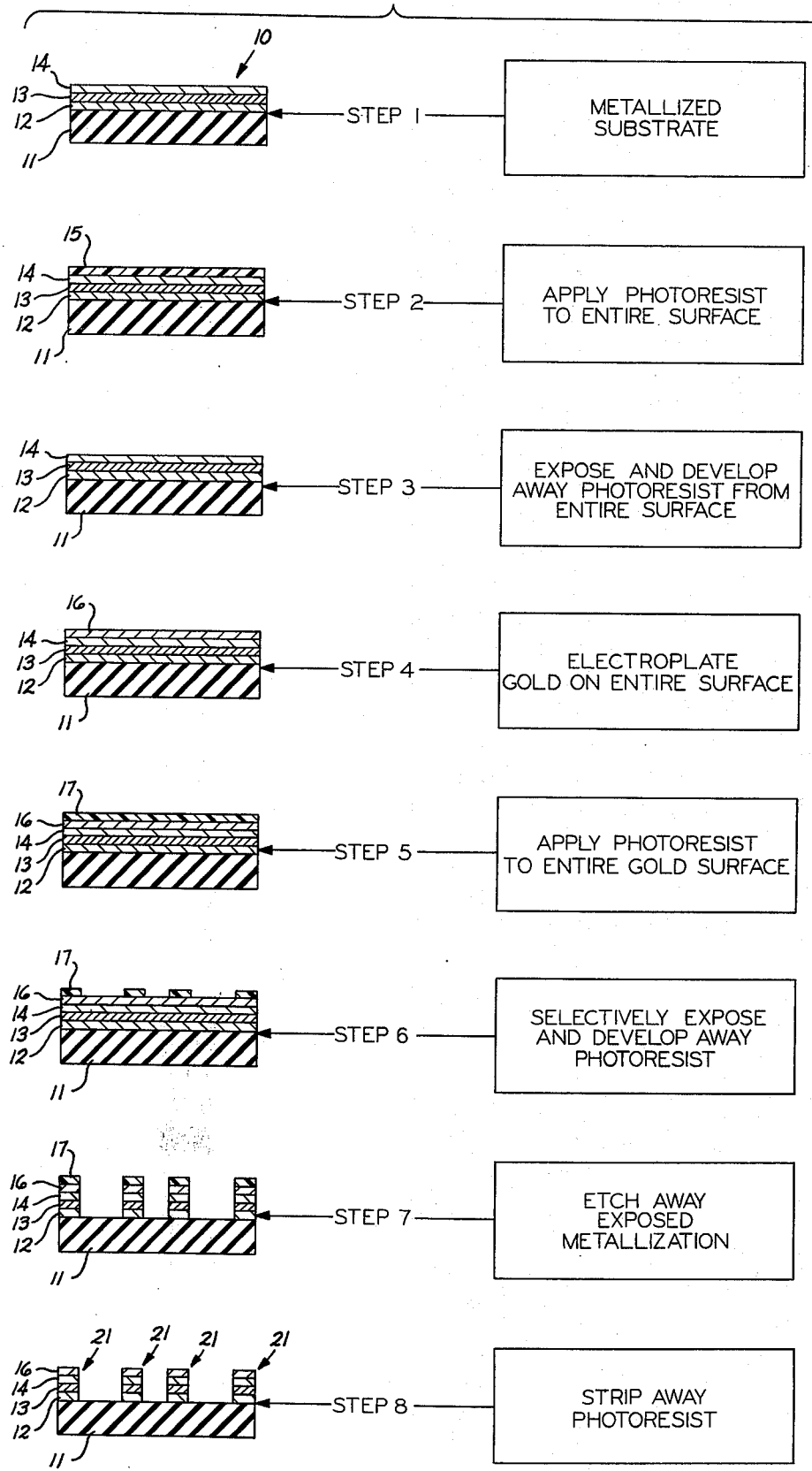
FIG. 1 is a block diagram showing the steps of the inventive method and includes corresponding cross-sectional views of the thin film metallized substrate at the respective steps.

FIG. 1 depicts the detailed steps relating to a preferred embodiment of the instant invention. A thin film metallized substrate, generally indicated by the numeral 10, comprising an insulative substrate 11 with a metallic base layer 12, a metallic glue layer 13 and a metallic diffusion barrier layer 14 is shown in step 1. The base layer 12 is used to form resistors and capacitors as is well known in the thin film circuit fabrication art. The metallic glue layer 13 provides good adhesion between the base layer 12 and materials to be deposited thereon in a later step, while the diffusion barrier layer 14 prevents diffusion of the metallic glue layer into those materials. Such a metallized substrate 10 may be manufactured in an independent process or purchased separately and is not considered to be inventively related to the instant method. However, step 1 is depicted in order to show the initial step required to fabricate a desired thin film circuit pattern on the insulative substrate 11.

In step 2 a first coating of a liquid photosensitive material 15 is applied to the surface of the barrier layer 14. The entire coating of photosensitive material 15 is then exposed and developed away from the surface of the barrier layer 14 in step 3. In step 4 the surface of the barrier layer 14 is electroplated with an electrically conductive material 16. A second coating of a photosensitive material 17 is applied to the surface of the conductive material 16 as depicted in step 5 and is selectively exposed and developed away as shown in step 6. The conductive material 16 along with the metallic layers 12, 13 and 14 that are not protected by the remaining photosensitive material 17 are then etched away as shown in step 7. Finally, in step 8 the remaing remaining material 17 is stripped from the conductive material 16 leaving a conductively coated thin film circuit pattern, generally indicated by the numeral 21.

Applicant has discovered a method of treating the thin film metallized substrate 10, prior to electroplating the conductive material 16 thereon, which method enhances the bondability of the resulting conductively coated metallized substrate. This, of course, will also enhance the bondability of the resulting thin film circuit pattern 21. The mechanism responsible for the advantageous enhancement of bondability is not fully understood. However, applicant theorizes that deleterious electroplating solution was being entrapped in the pores of the barrier layer 14 and/or the glue layer 13 when the conductive material 16 was electroplated onto the barrier layer. The electroplating solution then appears to diffuse into, and cause a degradation of, the glue layer 13 resulting in poor adhesion between the glue layer and the diffusion barrier layer 14.

Accordingly, applicant believes that by coating the surface of the barrier layer 14 with a liquid photosensitive material and then fully exposing and developing away that material, a residue of the photosensitive material remains in the pores of the barrier layer. It appears that the exposure of the photosensitive material to ultraviolet light, which travels in substantially straight lines, will not expose all the liquid photosensitive material in the recesses of the pores. Such unexposed residue of photosensitive material will not be affected by the developing solution and will remain in, and seal, the pores. Thus, when electroplating the conductive material 16 (step 4), no electroplating solution can be entrapped in the pores of the barrier layer 14. By precluding such entrapment of the electroplating solution, the adhesion between the glue layer 13 and the barrier layer 14 cannot be deleteriously affected thereby. This advantageously results in the enhanced bondability of the metallized substrate 10 having the conductive material 16 electroplated thereon.

In a specific example of the instant method, the base layer 12 of approximately 4,000 A of tantalum is sputtered onto the insulative substrate 11, made of ceramic material, and the glue layer 13 of 300 to 500 A of a combination of nickel and chrome, sold under the registered trademark of "Nichrome," is evaporated onto the base layer. The diffusion barrier layer 14 of about 3,000 A of palladium is then evaporated onto the glue layer 13. Approximately 4 microns of the first coating of the liquid photosensitive material 15 is applied to the surface of the diffusion barrier layer 14. The liquid photosensitive material 15 can be one of a variety of positive photoresist materials such as Shipley AZ-1350, AZ-1350J or AZ-340B, which is manufactured by Azoplate Corporation, Mountain Avenue, Murray Hill, New Jersey. The entire first coating of the liquid photosensitive material 15 which covers the diffusion barrier layer 14 is then exposed to ultraviolet light and developed away with Shipley AZ-303A, or a similar commercially available photoresist developer. Conventional "bath" or "spray" developing procedures may be used; however, the bath is preferred as it appears that the agitation associated with spraying undesirably removes some of the undeveloped photoresist from the pores of the diffusion barrier layer 14.

An example of the type of positive liquid photoresist which may be used in the instant method would be one comprising: 14–21% by weight cresol-formaldehyde novalak resin; 6 to 9% sensitizer; and 70 to 80% by weight solvent. The resin may be one of many commercially available resins such as Alnoval 429K, manufactured by Chemische Werke Albert, Wiesbaden, Germany. The composition of the solvent is comprised of; 6% toluene with traces of benzene, acetone and 0.4% water; 7% xylene; 7% butyl acetate; and 80% cellosolve acetate.

The conductive material 16 of approximately 15,000 A of gold is then electroplated on the surface of the barrier layer 14. Although various electroplating solutions could be used, the particular solution used in this process is an acid citrate gold bath comprised of: deionized water; potassium gold cyanide; and dibasic ammonium citrate. A second coating of photosensitive material 17 of about 4 microns of photoresist is deposited on the conductive material 16. A circuit pattern mask (not shown) is placed over the second coating of photosensitive material 17, which is then exposed and developed away leaving the desired circuit pattern covered with a protective coating of undeveloped photosensitive material. To remove the unprotected portion of the conductive layer 16 and underlying layers 12, 13 and 14, the entire surface is then subjected to various etchants, such as an aqueous solution of potassium iodide and iodine to remove gold and palladium; and aqueous solution of ceric ammonium nitrate to remove the "Nichrome"; and aqueous hydrofluoric acid and nitric acid to remove tantalum.

The protective, undeveloped photoresist pattern is then removed from the conductive material 16 by stripping with acetone or a similar agent leaving only the conductively coated circuit pattern 21 of gold plated thin films. The resulting conductively coated circuit pattern 21 (see step 8 of FIG. 1) maintains acceptable adhesion characteristics between the underlying thin films which, in turn, advantageously results in enhanced bondability of conductor leads (not shown) thereto.

The above example indicates specific materials that can be used in implementing the instant method; however, it should be realized that the instant method should not be limited to such materials. For instance, the insulative substrate 11 can also be made of glass, fiberglass impregnated epoxy or other well-known materials. The metallic base layer 12 may not be required when only thin film conductor paths (no discrete components) are to be fabricated; however, when used, the base layer 12 may be tantalum, "Nichrome" or similar metals. The glue layer 13 can be titanium, "Nichrome," chrome or the like. The metallic diffusion barrier layer 14 is normally palladium, while the electrically conductive material 16 could be copper, gold or other conductive materials.

FIG. 2 shows the results of an experiment in which a gold layer of material 16 was electroplated on thin film metallized substrates 10 as described in the above example, conductive leads (not shown) were bonded to the gold plated thin film conductive pattern 21 and 90°pull off tests were conducted. Curve 22 represents the results of 204 such pull off tests where there was no treatment of the metallized substrate by photoresist coating and developing away (steps 2 and 3 of FIG. 1) prior to electroplating of the layer of gold conductive material 16. Curve 23 represents 204 pull off tests in which steps 2 and 3 were included. It should be noted that a minimum acceptable lead pull off strength is two pounds. As can clearly be seen by comparing curves 22 and 23, the photoresist treated thin film metallized substrate had no pull strength below the two pound minimum and was consistently higher throughout the range of testing as compared to the untreated electroplated gold substrate.

Although the exemplary embodiment is described in the environment of thin film electrical circuitry, it should be clear that the instant method would have application in any area where it is desired to improve adhesion between thin metallic films which have metallic layers electroplated thereon.

What is claimed is:
1. A method for enhancing the bondability of a metallized substrate having a conductive material electroplated thereon, the method comprising the steps of:
   coating the entire metallized substrate with a positive liquid photoresist;
   exposing and developing away the entire coating of the positive liquid photoresist; and
   electroplating the conductive material on the metallized substrate.
2. A method of treating a metallized substrate having a plurality of metallic layers deposited thereon upon which a further coating of an electrically conductive material is electroplated, wherein said method precludes deterioration of the adhesion between the metallic layers and is characterized by:
   coating the entire metallized substrate with a positive liquid photoresist;
   exposing and developing away the entire coating of positive liquid photoresist; and
   electroplating the conductive material on the metallized substrate.
3. A method for enhancing the bondability of a gold electroplated thin film circuit on an insulative metallized substrate, comprising the steps of:
   1. depositing a first coating of a positive liquid photoresist on the entire metallized substrate;
   2. exposing and developing away the entire first coating of positive liquid photoresist;
   3. electroplating gold onto the metallized substrate;
   4. depositing a second coating of a photoresist onto the electroplated gold;
   5. exposing selected portions of the second coating of the liquid photoresist to light;
   6. developing away the exposed selected portions of the second coating of liquid photoresist;
   7. etching away the metal from which the selected portions of the second coating of liquid photoresist were removed to form a gold electroplated thin film circuit; and
   8. removing the undeveloped second coating of photoresist from the thin film circuit.
4. A method for enhancing the bondability of a gold electroplated thin film circuit, said method comprising the steps of:
   1. evaporating a metallic glue layer onto an insulative substrate;
   2. evaporating a metallic diffusion barrier layer onto the glue layer;
   3. coating the surface of the diffusion barrier layer with a positive liquid photoresist;
   4. exposing and developing away the entire coating of the positive liquid photoresist;
   5. electroplating a layer of gold onto the diffusion barrier layer; and
   6. selectively etching away portions of the gold layer, along with the glue and diffusion barrier layers thereunder, to form the thin film circuit.
5. The method as set forth in claim 4, which further comprises the additional step of:
   depositing a metallic base layer on the insulative substrate prior to step (1).
6. A method of manufacturing a gold plated ceramic substrate, comprising the steps of:
   evaporating a layer of titanium on a ceramic substrate;
   evaporating a layer of palladium on the titanium; and
   electroplating gold on the palladium layer, wherein deterioration of the adhesion between the titanium and palladium layers is precluded by:
   applying a positive liquid photoresist coating onto the entire palladium layer;
   exposing and developing away the entire photoresist coating; and
   electroplating gold onto the palladium layer.

* * * * *